United States Patent [19]
Doerr et al.

[11] Patent Number: 5,881,079
[45] Date of Patent: Mar. 9, 1999

[54] WAVELENGTH SELECTABLE LASER WITH INHERENT AND SINGLE-MODE STABILITY

[75] Inventors: Christopher R. Doerr, Atlantic Highlands; Charles H. Joyner, Red Bank, both of N.J.

[73] Assignee: Lucent Technologies Inc., Murray Hill, N.J.

[21] Appl. No.: 861,495

[22] Filed: May 22, 1997

[51] Int. Cl.[6] ........................................... H01S 3/10
[52] U.S. Cl. .......................... 372/20; 372/23; 372/29; 372/102
[58] Field of Search .......................... 372/18–20, 23, 372/29, 32, 43, 44, 50, 102

[56] References Cited

U.S. PATENT DOCUMENTS

| | | | |
|---|---|---|---|
| 5,373,517 | 12/1994 | Dragone et al. | 372/20 |
| 5,396,507 | 3/1995 | Kaminow et al. | 372/20 |
| 5,444,725 | 8/1995 | Zirngibl | 372/20 |
| 5,450,431 | 9/1995 | Glance et al. | 372/50 |
| 5,509,023 | 4/1996 | Glance et al. | 372/20 |
| 5,524,014 | 6/1996 | Kaminow et al. | 372/32 X |
| 5,675,592 | 10/1997 | Dragone et al. | 372/20 |

FOREIGN PATENT DOCUMENTS 0711011  8/1996  European Pat. Off. .

OTHER PUBLICATIONS

C. Dragone, "An N x N Optical Multiplexer Using a Planar Arrangement of Two Star Couplers", IEEE Photon. Technol. Lett., vol. 3, No. 9 (Sep. 1991) pp. 812–815.

C.R. Doerr et al., "Double–chirping of the Waveguide Grating Router", IEEEE Photon. Technol. Lett., vol. 9, No. 6 (Jun. 1977), pp. 1–3.

C.R. Doerr et al., "Chromatic Focal Plane Displacement in the Parabolic Chirped Waveguide Grating Router", IEEE Photon. Technol. Lett., vol. 9, No. 5 (May 1997), pp. 625–627.

B. Glance et al., "Applications of the Integrated Waveguide Grating Router", IEEE Journal of Lightwave Technology, vol. 12, No. 6 (Jun. 1994) pp. 947–962.

C.R. Doerr et al., "Chirping of the Waveguide Grating Router for Free–Spectral–Range Mode Selection in the Multifrequency Lasers", IEEE Photon. Technol. Lett., vol. 8, No. 4 (Apr. 1996) pp. 500–502.

R.J. Campbell et al., "Wavelength stable uncooled fibre grating semiconductor laser for use in an all optical WDM access network", Electronics Letters, vol. 32, No. 2 (Jan. 18, 1996) pp. 119–120.

J.B.D. Soole et al., "Multistripe Array Grating Integrated Cavity (MAGIC) Laser: A New Semiconductor Laser For WDM applications", Electron. Lett., vol. 28, No. 19 (Sep. 10, 1992) pp. 1805–1807.

M. Zirngibl et al., "An 18 Channel Multifrequency Laser", IEEEE Photon. Technol. Lett., vol. 8, No. 7 (Jul. 1996) pp. 870–872.

(List continued on next page.)

*Primary Examiner*—John D. Lee

[57] ABSTRACT

A single-mode stabilized laser comprises a laser cavity having a round trip time $\tau_r$ and a linewidth enhancement parameter $\alpha$; and a frequency routing device formed in the laser cavity comprising controllable frequency selective pathways such that selective gating of the frequency selective pathways causes selected lasing frequencies to be supported in the laser cavity separated by a frequency spacing $\Delta F_C$, $\Delta F_C = 1/\tau_r$. The frequency routing device has an optical grating having unequal length waveguides to form paths. The optical grating has arms, a time delay $\tau_f$ between the longest path and the shortest path, and a grating bandwidth $\Delta F_F$, $\Delta F_F = 1/\tau_f$, at least one of (1) $\alpha$ and (2) $\tau_r$ and $\tau_f$ having sufficient value to stabilize the laser in single-mode operation. A method of turning on a laser having a waveguide grating to a stable operating condition comprises the steps of applying an initial current to a first amplifier and maintaining a second amplifier off; allowing the laser to reach thermal equilibrium; applying an operating current to the second amplifier; and applying another operating current to the first amplifier to stably operate the laser.

23 Claims, 8 Drawing Sheets

OTHER PUBLICATIONS

C.R. Doerr et al., "Single Longitudinal–Mode Stability Via Wave Mixing in Long–Cavity Semiconductor Laser", IEEE Photon. Technol. Lett., vol. 7, No. 9 (Sep. 1995) pp. 962–964 Correction, vol. 7, No. 12 (Dec. 1995) p. 1522.

A.R. Vellekoop et al., "Four–Channel Integrated–Optic Wavelength Demultiplexer with Weak Polarization Dependence", J. Lightwave Technol., vol. 9, No. 3 (Mar. 1991) pp. 310–314.

C. Dragone, "Optimum Planar Bends", Electron. Lett., vol. 29, No. 12 (Jun. 10, 1993) pp. 1121–1122.

I.P. Kaminow et al., "Mode–Controlled Semiconductor Lasers", Guided–Wave Optoelectronics, New York: Springer–Verlag, (1990) pp. 218–219 [No Month].

A.A. Tager, "Side–Mode Suppression for Long DBR Lasers", IEEE Photon. Technol. Lett., vol. 7, No. 8 (Aug. 1995) pp. 866–868.

Doerr et al, "Chirped Waveguide Grating Router Multifrequency Laser with Absolute Wavelength Control" IEE Photonics Technology Letters, vol. 8, No. 12, Dec. 1996, pp. 1606–1608.

Doerr et al, "Wavelength Selectable Laser with Inherent Wavelength and Single–Mode Stability", IEEE Photonics Technology Letters, vol. 9, No. 11, Nov. 1997, pp. 1430–1432.

5,881,079

WAVELENGTH SELECTABLE LASER WITH INHERENT AND SINGLE-MODE STABILITY

FIELD OF THE INVENTION

The present invention relates in general to optical communications systems. In particular, the present invention describes a wavelength and single-mode stabilized laser and a method of operation used in optical communications systems.

BACKGROUND OF THE INVENTION

The capacity and speed of communications systems may be increased by transmitting information in optical form over networks composed of optically transmissive nodes, fibers, waveguides, and the like. High capacity optical communications systems require that many optical signals be frequency or wavelength division multiplexed in the components of an optical network. This requires that there be a way of conveniently producing electromagnetic energy at many different frequencies. An ideal device for producing optical energy useful in an optical communications system is a laser.

Wavelength division multiplexing (WDM) is a technology in which multiple wavelengths share the same optical fiber in order to increase the capacity and configurability of networks. Transmitters having high wavelength stability are crucial to WDM networks. Recently, many WDM transmitters having good wavelength stability have been introduced which use uncontrolled-mode-selection lasers. These lasers have a narrow intracavity filter which sets the lasing wavelength. Under the filter are many cavity modes, one of which is selected for lasing by gain nonlinearities. These lasers are uncontrolled; i.e., no attempt is made to actively place a certain cavity mode under the filter. An uncontrolled mode-selection laser comprises a laser containing an intracavity filter under which the cavity mode alignment is uncontrolled. Because of this lack of control, laser mode hops occur if the cavity modes drift too far with respect to the filter and outside the finite region of stability under the filter. The laser mode hops result in transmission errors.

As the channel spacing of WDM networks decreases, short-cavity lasers, such as distributed feedback (DFB) lasers, typically are wavelength stabilized using external means. To avoid external stabilization, the laser cavity can be lengthened, which reduces the lasing frequency shift per amount of amplifier heating power change (for a given amplifier length) and gain change (regardless of amplifier length). To further improve the wavelength stability, the intracavity filter can be completely placed in passive material. Such a laser is an uncontrolled-mode-selection laser, in which the cavity mode-to-filter alignment control is forsaken. Examples include a multiple-stripe array grating in a cavity (MAGIC) laser, a waveguide grating multifrequency laser, and a fiber grating semiconductor laser. Despite the lack of control, uncontrolled-mode-selection lasers lase in a single longitudinal mode via gain nonlinearities.

Although the art of semiconductor lasers is well developed, there remain some problems inherent in this technology. One particular problem is the instability that accompanies a laser at start-up and during subsequent operation. Therefore, a need exists for a method and structure for a wavelength selectable laser having inherent wavelength and single-mode stability.

SUMMARY OF THE INVENTION

The present invention provides a method and structure for a wavelength selectable laser having inherent wavelength and single-mode stability. The laser provides a well-defined set of frequencies and may be based upon photonic integrated circuitry.

According to one aspect of the present invention, a single-mode stabilized laser, comprises a laser cavity defined by two reflective elements in an actively doped semiconductor wafer, the cavity having a round trip time $\tau_r$ and a linewidth enhancement parameter $\alpha$; and a frequency routing device formed in the laser cavity comprising a plurality of controllable frequency selective pathways optically connecting the reflective elements such that selective gating of one or more of the frequency selective pathways causes selected one or more lasing frequencies to be supported in the laser cavity separated by a frequency spacing $\Delta F_C$, $\Delta F_C = 1/\tau_r$. The frequency routing device comprises an optical grating comprising a plurality of unequal length waveguides to form a plurality of paths including a longest path and a shortest path, the optical grating having (1) a plurality of arms including a longest arm and a shortest arm, each arm having a respective path length, (2) a time delay $\tau_f$ between the longest path and the shortest path, and (3) a grating bandwidth $\Delta F_F$, $\Delta F_F = 1/\tau_f$, at least one of (1) $\alpha$ and (2) $\tau_r$ and $\tau_f$ having sufficient value to stabilize the laser in single-mode operation.

According to another aspect of the present invention, the ratio $(\Delta F_C)^3/\Delta F_F$ is substantially maximized to stabilize the laser in single-mode operation. According to still another aspect of the present invention, the preferred values of $1/\tau_f$ is 32 GHz and $1/\tau_r$ is 3.5 GHz. In a further aspect of the present invention, $\alpha$ has a value in the range between 1 and 5.

According to another aspect of the present invention, a method of turning on a laser to a stable operating condition, the laser having a first amplifier connected to a first side of a waveguide grating and a second amplifier connected to a second side of the waveguide grating, the first amplifier operable at a first operating current and the second amplifier operable at a second operating current, comprises the steps of applying an initial current to the first amplifier and maintaining the second amplifier off, the initial current having a value greater than or equal to the first operating current; allowing the laser to reach thermal equilibrium; applying the second operating current to the second amplifier; and applying the first operating current to the first amplifier to stably operate the laser. The initial current has a preferred value greater than 100 mA.

According to yet another aspect of the present invention, a method of turning on a laser to a stable operating condition, the laser having a plurality of cavity modes and at least one amplifier connected to an optical grating, comprises the steps of applying an operating current to the amplifier by ramping an applied current from zero to the operating current; and tuning the optical grating while the applied current is being ramped to maintain the cavity modes in a fixed position relative to the optical grating. The tuning is preferably performed using a heater. The optical grating is preferably a fiber grating or a waveguide grating.

The foregoing and other aspects of the present invention will become apparent from the following detailed description of the invention when considered in conjunction with the accompanying drawings.

DESCRIPTION OF EXEMPLARY EMBODIMENTS AND BEST MODE

The present invention presents an inherently wavelength and single-mode stabilized laser that is selectable between a predetermined number of precisely spaced wavelengths. A multifrequency waveguide grating router laser according to the present invention consists of a waveguide grating router integrated with semiconductor optical amplifiers. N ports at one end of the router terminate in optical amplifiers with cleaved mirror facets, and one port at the other end terminates in a shared optical amplifier connected to a high reflector mirror. Each of the N resonant cavities contain a different intracavity filter frequency due to the router. These intracavity filters are precisely spaced with respect to each other, resulting in a multifrequency waveguide grating router laser output consisting of N precisely spaced laser frequencies.

A wavelength selectable laser having inherent wavelength and single-longitudinal-mode stability is provided. Wavelength stabilization is accomplished by a long cavity and a passive intracavity chirped waveguide grating router, and the single-mode stabilization is accomplished using gain nonlinearities, aided by narrow router passbands made possible by high $\Delta n/n$ waveguides (n is the refractive index of the material) and wide bends.

In specific terms, one example of the invention comprises a 1×N frequency routing device formed on a semiconductive wafer between two reflective facets. Waveguides associated with the device each contain an integrated optical amplifier selectively acting as a gate to prevent the flow of optical energy through a respective waveguide or as a gain providing element which amplifies optical energy flowing through a respective waveguide.

Selective ones of the optical amplifiers may be activated with bias current so that lasing action occurs in a predetermined path between the reflective faces. This path is such that lasing action is supported at a particular selected frequency. The laser is tunable to any of N frequencies equal to the number of input waveguides associated with the frequency routing device.

Figure 1:
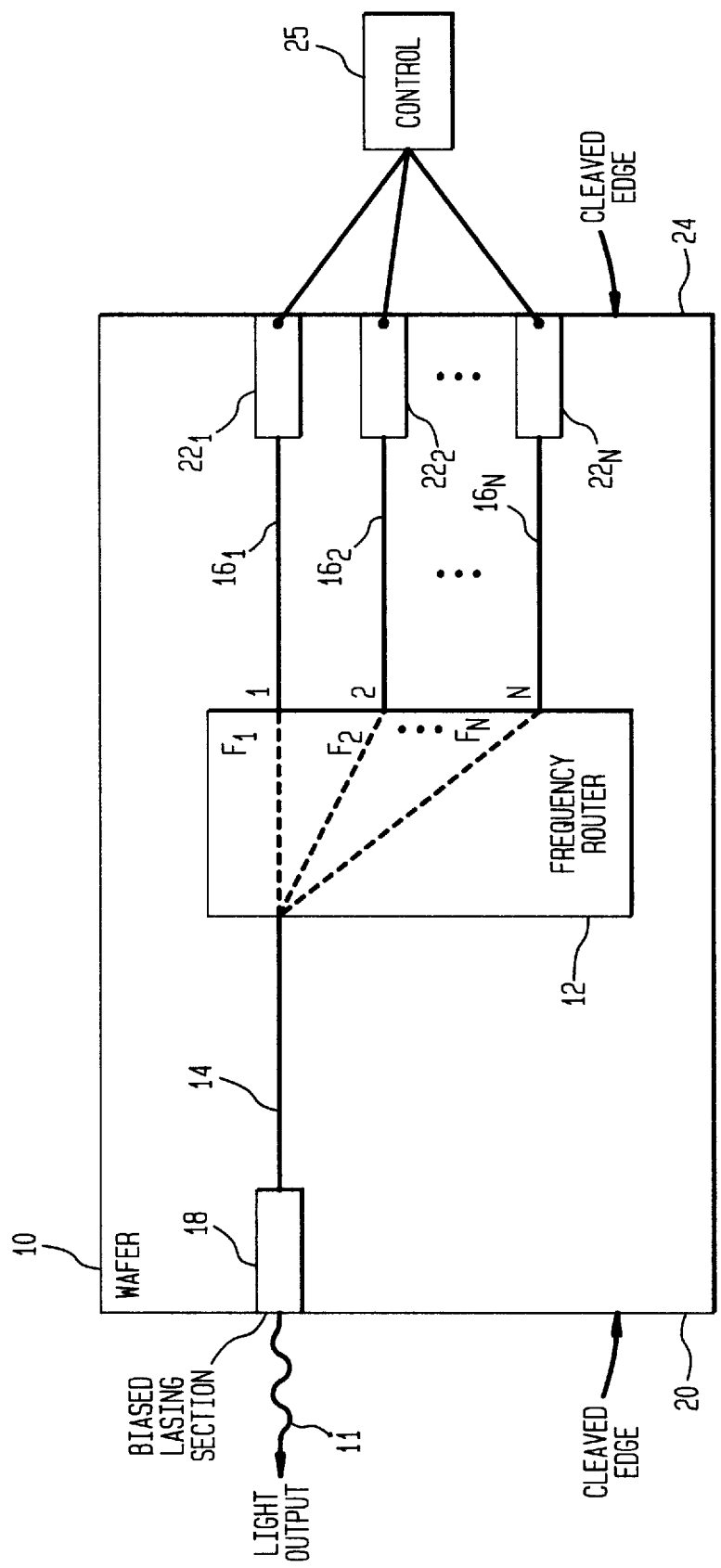
FIG. 1 is a diagram of an example of a tunable laser in accordance with the present invention.

FIG. 1 shows an example of a laser which is tunable over a wide frequency range. It is composed of a 1×N frequency routing device for providing frequency selectivity, a number of waveguides for carrying optical signals, and a number of optically active sections for providing optical amplification and lasing behavior. These structures may be monolithically integrated on a semiconductive wafer and may be created by means of known photolithographic techniques.

FIG. 1 illustrates a wafer 10 made of a semiconductive material such as an indium phosphide-based material such as InGaAsP. A 1×N frequency routing device 12 is defined on the wafer 10. A waveguide 14 is connected to one end of the frequency routing device 12. A set of waveguides $16_1$, $16_2$, . . . , $16_N$ is connected to another end of the frequency routing device 12. A shared optical amplifier 18 connects the first waveguide 14 to a cleaved edge or face 20 formed in the semiconductive wafer 10. A switched amplifier array comprising a set of optical amplifiers $22_1$, $22_2$, . . . , $22_N$ connects respective ones of the set of waveguides $16_1$, $16_2$, . . . , $16_N$ to a second cleaved edge or face 24 formed in the wafer 10. The two cleaved faces 20 and 24 comprise reflective mirrors defining a tuned cavity in which lasing action can be supported. A control circuit 25 selectively provides bias current to predetermined ones of the optical amplifiers $22_1$, $22_2$, . . . , $22_N$ to produce laser light at one of N discrete frequencies as light output as indicated at reference numeral 11 in FIG. 1.

Each optical amplifier comprises a doped section of waveguide with controllable optical transmissivity. The doping may be such that an appropriately configured semiconductor junction is defined in each optical amplifier. These sections are optically active in that application of electrical energy to those sections will cause them to become transmissive to the flow of optical energy and will even provide some degree of gain to optical signals flowing through them. When electrical bias current above a lasing threshold is applied, laser action begins. These doped sections of waveguide are substantially opaque to the transmission of light when there is no applied electrical stimulation. The specially doped sections thus may be considered to be gates or optical amplifiers depending upon whether or not they are excited with electrical energy. The details of creating such sections in a wafer such as the wafer 10 shown in FIG. 1 are generally known, are not a part of this invention, and thus are not described here.

Selectively applying bias current to predetermined ones of the optical amplifiers $22_1$, $22_2$, . . . , $22_N$ in FIG. 1 will create certain frequency selective optical pathways between the cleaved faces 20 and 24 due to the behavior of the frequency routing device 12. Application of a certain amount of bias current above a lasing threshold to the selected ones of the optical amplifiers will cause lasing action at a frequency supported in the frequency selective optical pathways. Those optical amplifiers which are not given any bias current remain opaque to the transmission of optical energy through them.

The frequency routing device 12 is such that an optical signal having a frequency $F_1$ appearing on the waveguide 14 and flowing toward the device 12 will be directed to the waveguide $16_1$. An optical signal having a frequency $F_1$ directed toward the frequency routing device 12 on waveguide $16_1$ will be directed to the waveguide 14. An optical signal having a frequency $F_2$ appearing on waveguide 14 and flowing toward the device 12 will be directed to the waveguide $16_2$. An optical signal having a frequency $F_2$ directed toward the frequency routing device 12 on waveguide 162 will be directed toward waveguide 14. In general, an optical signal having a frequency $F_N$ appearing on waveguide 14 and flowing toward the device 12 will be directed to a waveguide $16_N$ by the frequency routing device. Similarly, an optical signal having a frequency $F_N$ appearing on a waveguide $16_N$ and flowing toward the frequency routing device 12 will be directed to waveguide 14.

The edges 20 and 24 of the wafer at the ends of the shared optical amplifier 18 and the sets of optical amplifiers $22_1$, $22_2$, ..., $22_N$ are cleaved to form reflective mirrors with a tunable cavity between them. The amplifiers on one side of the frequency routing device 12 are used as gates opened by the bias current. When these gates are biased by an appropriate current, for example 10 to 20 mA, these gates become optically transparent with perhaps some gain depending on the level of the bias current. They are highly optically lossy at a zero bias current. One of these optical amplifiers on one side of the wafer 10 is biased so that it is optically transmissive. The other optical amplifiers on the same side are unbiased. On the other side of the frequency routing device 12, the shared optical amplifier 18 is biased above a lasing threshold. Application of bias current to the optical amplifiers in this manner determines a transparent route between the mirrors for lasing action. Along this route, stationary waves can be sustained for frequencies within a passband associated with this route. Frequencies outside this passband are suppressed by the lossy unbiased optical amplifiers. Lasing occurs at the Fabry-Perot mode whose frequency is nearest the passband maximum. Adjacent Fabry-Perot modes are suppressed by passband selectivity which can be adjusted by appropriate circuit design.

There are N passbands $\Delta F$ wide repeated periodically with a free spectral range (FSR) period N $\Delta F$. Assuming that the gain of the active semiconductive medium peaks sufficiently over one of these FSRs, or alternatively, the grating can be chirped to provide a passband selection, N lasing frequencies can be obtained in this FSR by appropriate activation of selected optical amplifiers in the wafer 10. Frequencies outside this FSR are suppressed by gain discrimination. Tuning can thus be achieved at discrete frequencies separated by intervals $\Delta F$ over a tuning range N $\Delta F$. In addition, combinations of lasing frequencies can be obtained by activating more than one amplifier section on one side of the device 12. Furthermore, amplifier sections can be modulated in order to send information.

Described here are a couple of examples illustrating how the laser of FIG. 1 may be tuned to a plurality of discrete optical frequencies. If it is desired that the laser of FIG. 1 produce optical energy at a frequency $F_1$, bias current is applied to optical amplifier 18 and optical amplifier $22_1$. The bias current applied to the optical amplifier $22_1$ is above the lasing threshold for the semiconductor material. An optically transmissive path is thereby defined between the reflective faces 20 and 24 comprising the optical amplifier 18, the waveguide 14, the frequency routing device 12, the waveguide $16_1$, and the optical amplifier $22_1$. An optical standing wave is created between the faces 20 and 24 at the frequency $F_1$ and laser light at that frequency is output by the device of FIG. 1 as shown by reference numeral 11. The faces may be partially or totally reflective. Similarly, if it is desired that the laser of FIG. 1 produce optical energy at a frequency $F_2$, bias current is applied to the optical amplifier 18 and the optical amplifier $22_2$. The bias current applied to the optical amplifier $22_2$ is above the lasing threshold for the semiconductor material. An optically transmissive path is thereby defined between the faces 20 and 24 comprising the optical amplifier 18, the waveguide 14, the frequency routing device 12, the waveguide $16_2$, and the optical amplifier $22_2$. An optical standing wave is created between the faces 20 and 24 at the frequency $F_2$ and laser light at that frequency is output by the device of FIG. 1 as shown by reference numeral 11. Optical energy at frequencies $F_3$ to $F_N$ may be produced by activating optical amplifiers $22_3$ to $22_N$, respectively, instead of activating the optical amplifiers $22_1$ or $22_2$. The output frequency produced by the laser in FIG. 1 may rapidly be changed by changing which optical amplifier receives bias current.

Figure 2:
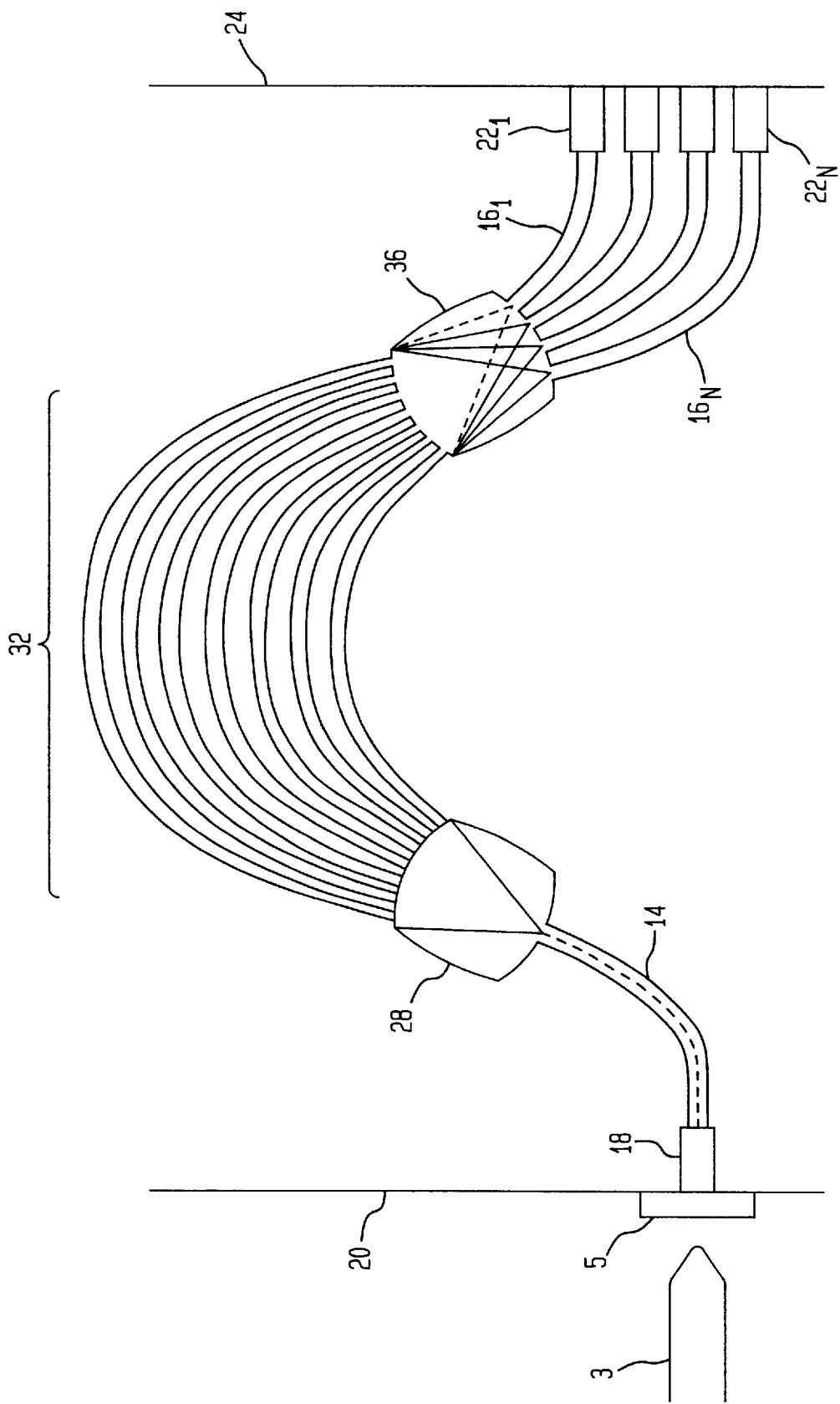
FIG. 2 is a further detailed diagram of the exemplary tunable laser of FIG. 1.

FIG. 2 shows a further detailed diagram of the exemplary tunable laser of FIG. 1. The frequency router 12 of FIG. 1 comprises an optical grating 32, preferably a waveguide grating, which is between free space regions 28 and 36. The shared amplifier 18 is connected to a high reflector mirror 5 which provides output light to an optical fiber 3.

Figure 3:
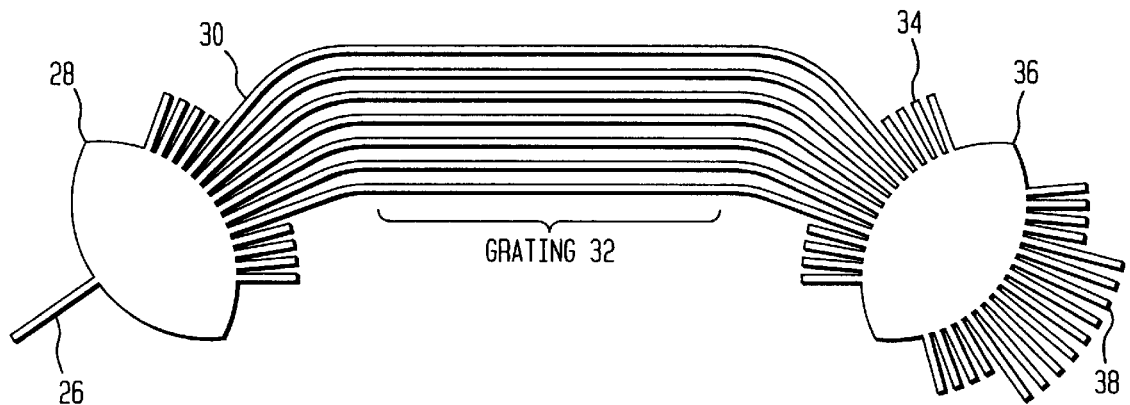
FIG. 3 is a diagram illustrating the details of the frequency routing device shown in FIG. 1.

FIG. 3 shows the pertinent details of an example of a routing device 12 shown in FIGS. 1 and 2. The frequency routing device contains an input waveguide 26 connected to a free space region 28. A set of output waveguides 30 extends from the free space region 28 and is connected to an optical grating 32, preferably a waveguide grating. The optical waveguide grating 32 comprises a set of unequal length waveguides which provides a predetermined amount of path length difference between the output waveguides 30 and a corresponding set of input waveguides 34 connected to another free space region 36. The free space region 36 is connected to a set of output waveguides 38. These frequency routing devices operate as multiplexers and demultiplexers of optical frequencies. In the case of the frequency routing device 12 in FIG. 1, the input waveguide 26 may be connected to the waveguide 14. The set of output waveguides 38 are connected to the waveguides $16_1$, $16_2$, ..., $16_N$ in the device of FIG. 1.

With respect to chirping of the optical waveguide grating 32, the path lengths of the waveguides in the optical grating have a nonlinear distribution, preferably a parabolic distribution, so that the optical grating has only one dominant passband in the wavelength region of interest for each frequency selective pathway. Moreover, (1) the angular positions of the grating waveguides 34 entering the second free space region 36 preferably have a nonlinear distribution, such as a parabolic distribution, and/or (2) the radial locations of the entrances of the output waveguides 38 in the second free space region 36 are nonconstant, so that the peak transmissivities and bandwidths of each dominant passband of the grating are substantially the same.

The laser of FIG. 1 may be tuned to a large number of different optical frequencies used in high speed, high capacity optical communications networks. For example, frequency routing devices with N up to 8 or more may be conveniently fabricated on a single semiconductive wafer. This results in a tunable laser which can be tuned to any of up to 8 or more optical frequencies. For example, a laser using a 1×8 frequency routing device providing passbands spaced by 50 GHz will yield 8 potential frequencies of operation distributed regularly at 50 GHz intervals over a tuning bandwidth of 400 GHz. The doped sections comprising the optical amplifiers in FIG. 1 may be switched on or off at up to nanosecond speeds thereby resulting in rapid tuning of the FIG. 1 laser to the desired frequencies. Devices such as the laser in FIG. 1 are attractive for optical network applications based on wavelength division multiplexing.

The inventors have determined that the behavior of the light in a laser that consists of a semiconductor optical amplifier and a separate grating is described by the following equations:

$$\dot{n}(t) = \frac{I}{ev} - \frac{N_t}{\tau_n} - \frac{n(t)}{\tau_n}\left(1 + \frac{m^2(t)}{P_{sat}}\right) \quad (1)$$

$$\dot{m}(t) = G\dot{n}(t)m(t) + \frac{1}{\tau_f}\exp[Gn(t) - L]\{\cos[y(t,\tau_1)]m(t+\tau_1) - \cos[y(t,\tau_2)]m(t+\tau_2)\} \quad (2)$$

$$\dot{\phi}(t) = G\alpha\dot{n}(t) - \Omega + \frac{1}{\tau_f}\exp[Gn(t) - L]\left\{\sin[y(t,\tau_1)]\frac{m(t+\tau_1)}{m(t)} - \sin[y(t,\tau_2)]\frac{m(t+\tau_2)}{m(t)}\right\} \quad (3)$$

where $y(t,\tau)=G\alpha n(t)+\Omega\tau+\phi(t+\tau)-\phi(t)+\theta$, $\tau_1=-\tau_r+\tau_f/2$, and $\tau_2=-\tau_r-\tau_f/2$. $n(t)$ is the carrier density in the amplifier, $m(t)$ is the magnitude of the light in the laser, and $\phi(t)$ is the phase of the light in the laser. $\Omega$ is the frequency offset with respect to the filter peak. The remaining parameters are set forth in Table 1. The stability of single-mode operation can be calculated by linearizing equations (1) to (3) when $m(t)=$ constant and $\phi(t)=$constant about a single-mode operating point and obtaining the eigenvalues. The further the eigenvalues are in the right-half of the complex plane, the more stable is the single-mode condition.

By choosing the parameters to achieve the highest stability, a laser, having one or more semiconductor optical amplifiers and a separate grating, is achieved that has stable single-mode operation.

TABLE 1

Parameters and preferred values.

| Variable | Description | Preferred value |
|---|---|---|
| I | injection current into the amplifier | 140 mA |
| e | charge of an electron | $1.6 \times 10^{-19}$ C |
| v | amplifier active volume | |
| Nt | transparency carrier density | $1 \times 10^{24}$ m$^{-3}$ |
| $\tau$n | spontaneous emission time | 300 ps |
| Psat | amplifier saturation power | 16 mW |
| G | amplifier amplitude gain/n | $9.6 \times 10^{-25}$ m$^3$ |
| L | $-$ln (total cavity power transmissivity)/2 | 1.5 |
| $\alpha$ | linewidth enhancement parameter | 5 |
| $\epsilon$ | gain nonlinearity coefficient | 2.6 W$^{-2}$ |
| $\tau$f | time delay between longest and shortest paths in the grating | |
| $\tau$r | round trip time in the cavity | |

An exemplary laser consisting of a semiconductor amplifier and a waveguide grating is described. $\tau_f$ and $\tau_r$ are chosen such that $1/\tau_r=3.5$ GHz, and $1/\tau_f=32$ GHz, and the other parameters are as given in Table 1. $\tau_f$ determines the size of the grating and the filter bandwidth. The larger the $\tau_f$, the narrower the filter but the larger the grating and thus the longer the laser cavity. A longer cavity implies a smaller $\tau_r$. The inventors have determined that these values of $\tau_f$ and $\tau_r$ give the most negative limit on the real part of the eigenvalues and thus gives the highest stability. Note that the carrier depletion term, $m^2$, in equation (1) is the field at the output of the amplifier, which is a reasonable approximation for a laser above threshold.

To analyze the stability of the single-longitudinal mode operation, let $m(t)=$constant and $\phi(t)=$constant. From equations (1) to (3), the single-mode points occur at $$n(t) = n_0 = \frac{1}{G}\left[L - \ln\left(\frac{\sin\Omega\tau_f/2}{\Omega\tau_f/2}\right)\right] \quad (5)$$

$$m(t) = m_0 = \sqrt{P_{sat}\left(\frac{\frac{I\tau_n}{ev} - N_t}{n_0} - 1\right)} \quad (6)$$

$$\phi(t)=\phi_0=\text{arbitrary constant} \quad (7)$$

Also, $\Omega$ is constrained by $\exp(jG\alpha n_0+j\theta)=\exp(j\Omega\tau_r)$; i.e., the lasing is constrained to the cavity modes. In the following, $\theta$ varies such that $\Omega$ can be any value. Expanding equations (1) to (3) in Taylor series about the single-mode points, keeping only the zeroth and first-order terms, and taking the Laplace transform, one obtains $$s\begin{bmatrix}\tilde{n}\\\tilde{m}\\\tilde{\phi}\end{bmatrix} = A(s)\begin{bmatrix}\tilde{n}\\\tilde{m}\\\tilde{\phi}\end{bmatrix} \quad (8)$$

where $\tilde{n}$, $\tilde{m}$, and $\tilde{\phi}$ are the Laplace transforms of $n(t)-n_0$, $m(t)-m_0$, and $\phi(t)-\phi_0$, respectively. $A(s)$ is a matrix with the elements $$A_{11} = -\frac{1 + m_0^2/P_{sat}}{\tau_n}, A_{12} = -\frac{2n_0 m_0}{\tau_n P_{sat}}, A_{13} = 0$$

$$A_{21} = -Gm_0\left(\frac{1 + m_0^2/P_{sat}}{\tau_n} + \alpha\Omega\right),$$

$$A_{22} = -\frac{2Gn_0 m_0^2}{\tau_n P_{sat}} + \frac{\Omega/2}{\tan(\Omega\tau_f/2)}[\exp(s\tau_1) - \exp(s\tau_2)]$$

$$A_{23} = -\Omega m_0\left(1 - \frac{\exp(s\tau_1) + \exp(s\tau_2)}{2}\right)$$

$$A_{31} = G\left(\Omega - \alpha\frac{1 + m_0^2/P_{sat}}{\tau_n}\right),$$

$$A_{32} = -\frac{1}{m_0}\left[\frac{2G\alpha n_0 m_0^2}{\tau_n P_{sat}} + \Omega\left(1 - \frac{\exp(s\tau_1) + \exp(s\tau_2)}{2}\right)\right]$$

$$A_{33} = \frac{\Omega/2}{\tan(\Omega\tau_f/2)}[\exp(s\tau_1) - \exp(s\tau_2)]$$

Figure 4:
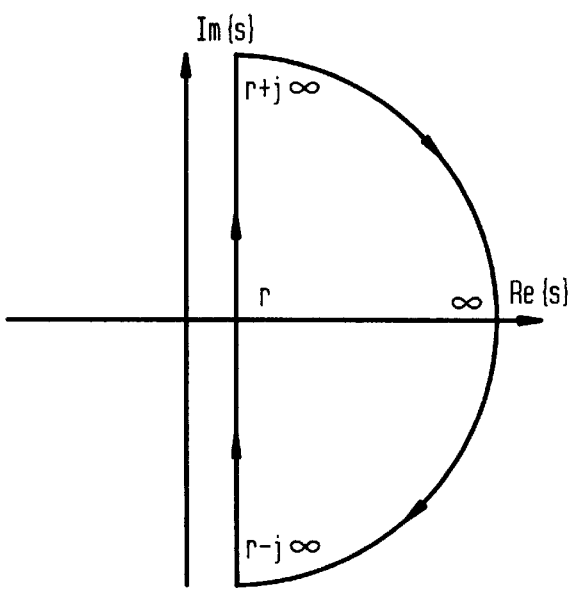
FIG. 4 is a graph of a contour in the s-plane of an exemplary laser in accordance with the present invention.

The single-mode stability is given by the locations of the solutions (roots) of the equation $\det[A(s)-Is]=0$. The Principle of the Argument Theorem is used to localize the roots. A contour in the s-plane is shown in FIG. 4 with the left edge of the contour running from $s=-j\infty+r$ to $j\infty+r$, where r is a real variable. The contour is mapped into a new complex plane using $\det[A(s)-Is]$. The number of roots inside the contour in the s-plane equals the net number of times the origin is encircled in a clockwise direction in the mapped plane. The smallest r, $r_{min}$, for which there are no net clockwise encirclements of the origin is then determined. If $r_{min}$ is less than 0, the system is stable, and the more negative $r_{min}$ is, the more robust the system is to model changes.

The roots on the imaginary axis, at $s=0$, $\pm j\Omega$ in linearized models do not give reliable information about the stability of their corresponding nonlinear system, so these roots are ignored in the stability analysis.

Plots of $r_{min}$ vs. $\Omega$ are shown in FIGS. 5(a)–5(d) for variations in four parameters: $\alpha$, $\tau_f$, I, and $\tau_r$. In an exemplary waveguide grating router multifrequency laser according to the present invention in which $g_0=1.6\times1.0^{-12}$ m³/s, $\tau_n=300$ ps, $A=0.6\times1.2$ $\mu$m², $\Gamma=0.04$ $\mu$m/0.6 $\mu$m, $N_t=1.0\times10^{24}$ m⁻³, $l_a=1.5$ mm, $v=\Gamma Al_a$, $L=-0.5\ln(0.05)$ (i.e., cavity loss= 13 dB), and $v_g=8.31\times10^7$ m/s, there is an asymmetric region of stability with a maximum near the filter peak ($g_0$ is the amplifier temporal gain constant, $\tau_n$ is the spontaneous emission time, A is the optical mode cross-sectional area, $\Gamma$ is the amplifier mode confinement factor, $l_a$ is the amplifier length, L is the cavity amplitude loss, and $v_g$ is the group velocity). Single-mode operation will remain single-mode in the stable region. When the lasing mode is moved with respect to the filter such that the lasing frequency exits the stability region, a mode-hop will occur with the new mode ending up back somewhere in the stability region.

Figure 5A:
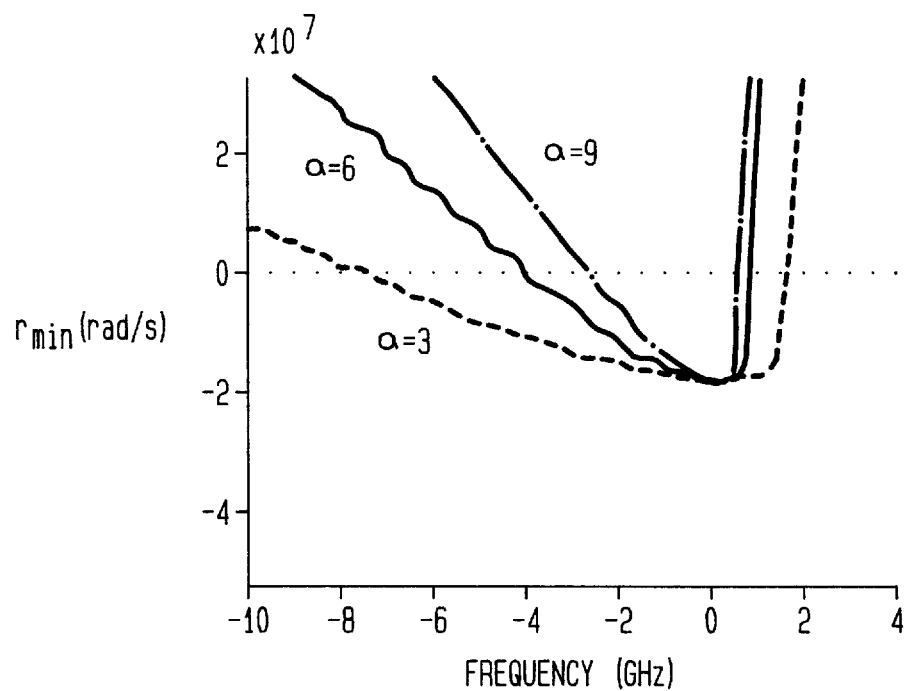
FIGS. 5(a)–5(d) are graphs of a constant vs. the frequency offset for variations in four parameters, $\alpha$, $\tau_p$, I, and $\tau_r$, respectively.
Figure 5B:
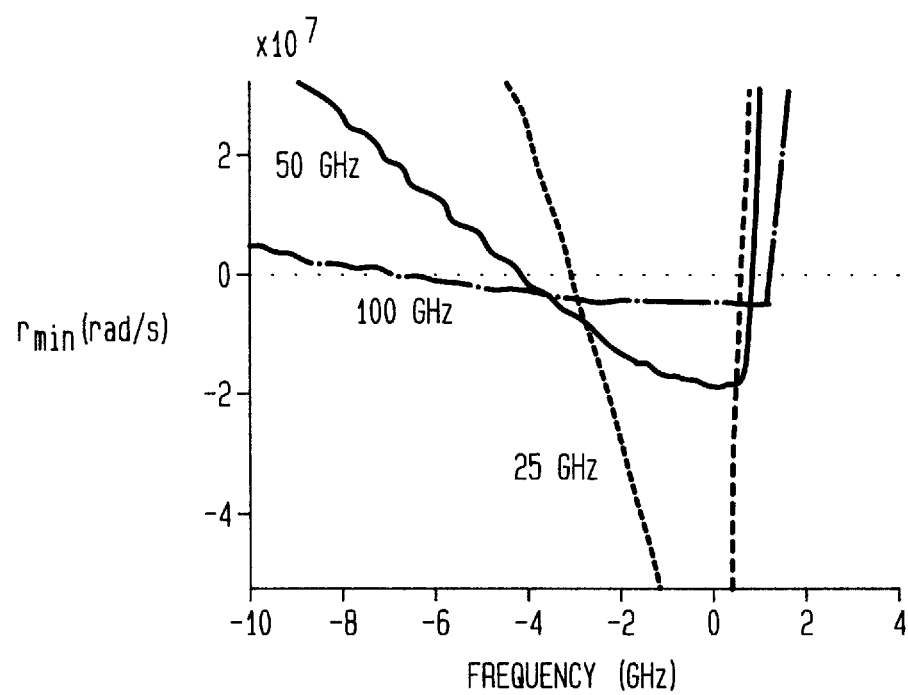
Figure 5C:
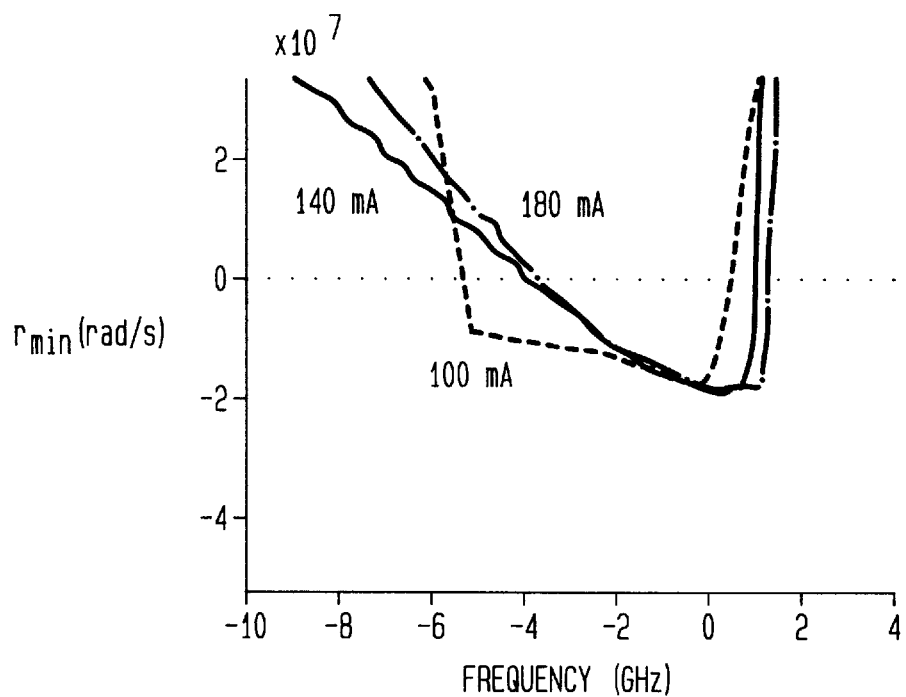
Figure 5D:
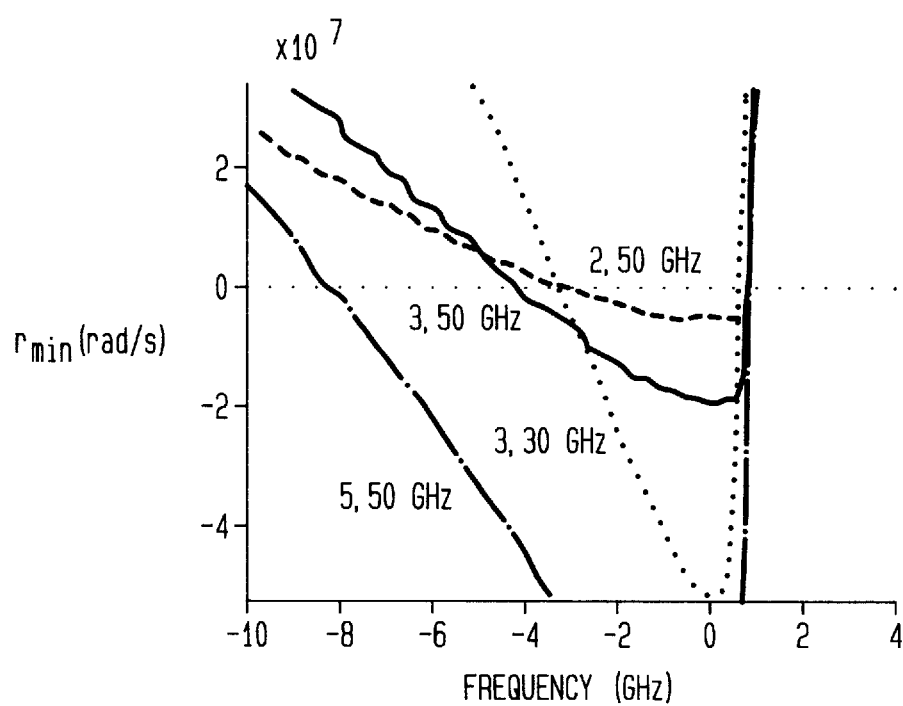

FIG. 5(a) shows that decreasing $\alpha$ increases the stability width and leaves the depth unchanged. FIG. 5(b) shows that decreasing the filter bandwidth (increasing $\tau_f$) decreases the stability width but significantly increases the depth. FIG. 5(c) shows that the stability is relatively insensitive to the drive current, I (the sharp corner in the 100 mA curve occurs as the laser goes below threshold). FIG. 5(d) shows that decreasing the cavity length (decreasing $\tau_r$) increases both the stability width and depth. FIG. 5(d) also compares two cases where $\tau_f/\tau_r$ is kept constant. $\tau_r$ has a more significant effect on the stability than $\tau_f$. Thus, to maximize the stability depth of the laser, the shortest possible cavity should be used that can hold a filter narrow enough to give the desired wavelength accuracy. The filter peak should be detuned to the low wavelength side of the gain peak in order to minimize $\alpha$.

The two main parameters that can be controlled in the design of a laser that consists primarily of one or more semiconductor optical amplifiers and a separate filter or grating is the frequency spacing of the laser cavity modes, $\Delta f_C$, and the filter or grating bandwidth, $\Delta f_F$ ($\Delta f_C=1/\tau_r$, $\Delta f_F=1/\tau_f$). To achieve maximum stability for single-longitudinal-mode operation, the ratio $$\frac{(\Delta f_C)^3}{\Delta f_F} \qquad (9)$$

is substantially maximized. Because $\Delta f_C$ depends on $\Delta f_F$, this results in a specific optimum $\Delta f_C$ and $\Delta f_F$ for a given laser structure.

For a laser consisting of one or more semiconductor optical amplifiers and a waveguide grating router in semiconductor material, equation (9) is maximized when the path-length difference between the longest and shortest arms of the grating is approximately equal to preferably one sixth of the length the laser cavity would have if the grating contained only one waveguide arm.

Stability can be increased further by designing the laser such that the linewidth enhancement parameter $\alpha$, which is the ratio of the real part to the imaginary part of the index of the semiconductor optical amplifier, is preferably between 1 and 5.

According to one preferred embodiment, an 8 channel× 200 GHz wavelength selectable laser having inherent wavelength and single-longitudinal-mode stability is provided. The wavelength stabilization is accomplished using a long cavity and a passive intracavity chirped waveguide grating router. Single-mode stabilization is accomplished by gain nonlinearities, aided by narrow router passbands made possible by high refractive index contrast ($\Delta n/n$) waveguides and wide bends. In other words, to achieve high wavelength stability, a waveguide-grating-router-based laser design, having a passive comb of intracavity filters, is used. To maximize the single-mode stability, the cavity length, intracavity filter bandwidth, cavity imperfections, and linewidth enhancement parameter $\alpha$ are minimized. In other words, a long-cavity semiconductor laser has a stable region of single-mode operation when the intracavity filter is sufficiently narrow.

Figure 6:
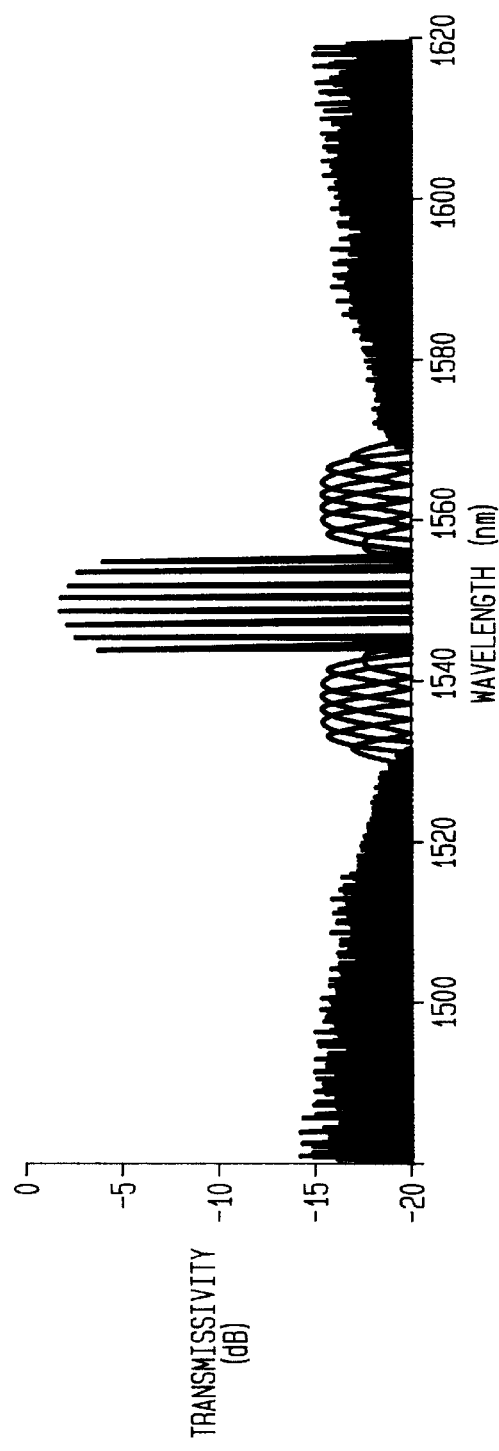
FIG. 6 is a graph of calculated intracavity waveguide grating router transmissivities between the shared port and each array port vs. wavelength for an exemplary device in accordance with the present invention.

Wavelength stability (and frequency granularity—the channel spacing standard deviation is approximately equal to the cavity-mode spacing) is more easily accomplished using a long cavity and single-mode stability is more easily accomplished using a short cavity; therefore, a compromise cavity mode spacing of 3 GHz is used. To achieve the narrowest possible intracavity router passband for this cavity length, high $\Delta n/n$ waveguides (n is the refractive index of the material and $\Delta n/n=0.8\%$) and wide bends are employed, with 80 grating arms and full use of the first Brillouin zone. To highly suppress the neighboring grating orders with no penalty for the desired order, yet minimize router geometry distortions, the router is both parabolic double-chirped and focal-length adjusted ($\gamma$, the chirp that is applied, for the arms=8, $\gamma$ for the array free-space angles=4, and $\gamma$ for the focal length adjustment=4). The calculated transmissivity of the router is shown in FIG. 6, with a 3 dB passband width of 23 GHz. The two main cavity imperfections that are minimized are intracavity reflections and multitransverse moding. The main intracavity reflections occur at the active-passive interface (the waveguiding structure is a buried rib-loaded slab with quantum wells on top that are etched away over the passive regions) and are minimized by using only 3 quantum wells and angling the transitions. The multitransverse moding is minimized by careful router design. To minimize $\alpha$, the gain peak can be offset to longer wavelengths from the main grating order. The array amplifiers and shared amplifier lengths are each 950 $\mu$m. Because of the optimized doping levels, the straight waveguide losses are below 1 dB/cm.

As described above, laser mode hops occur if the cavity modes drift too far with respect to the filter because there is a finite region of stability under the filter. The laser mode hops result in transmission errors. These problems are mitigated by laser start-up according to the present invention. Conventionally, the laser is turned on simply by turning up the drive current(s) on the amplifiers from zero to the operating condition. Using the conventional method, the cavity length changes, due to amplifier heating and/or amplifier carrier density changes, enough with respect to filter to cause a mode hop. After a mode hop, the new lasing mode is somewhat random and can be near instability which results in another mode hop soon thereafter.

Because the laser preferably starts lasing very near the filter center, and if this starting lasing condition goes to the operating condition without any significant change in the cavity length, so that no mode hop occurs, then the location of the lasing mode with respect to the filter can be accurately known and transmission errors are reduced. When the lasing mode moves past the stability range, a mode hop occurs, and the laser selects a new mode. Thus, to ensure long-term stability, the lasing mode at the operation condition is preferably be in the center of the stability range. This is achieved by the appropriate start-up sequence.

One method of laser start-up according to the present invention includes the steps of turning one amplifier (e.g., the shared amplifier) up to a very high current (greater than or equal to the operating current) while maintaining a second amplifier (of the amplifier array) off, and waiting for thermal equilibrium to be reached in the laser. After reaching thermal equilibrium, the second amplifier is turned on to its operating current, and then the current of the first amplifier is decreased to its operating current. The lasing starts near the center of the filter. As the current is increased, the total carrier density in the cavity remains substantially constant. Thus, the full operating condition is in the center of the stability range. This method is preferable for monolithically integrated devices, such as a waveguide grating wavelength selectable laser.

Another method of laser start-up according to the present invention is to control the temperature of an optical grating as the current of the amplifier(s) is increased to its operating condition(s). In other words, the amplifier(s) is turned on, and as is it turned up, the optical grating is tuned to maintain the cavity modes in a fixed position relative to the grating. The optical grating can be tuned using a conventional heater. Another method of laser start-up according to the present invention is to control the effective length of the amplifier(s) as the current of the amplifier(s) is increased to its operating condition(s). In other words, the amplifier(s) is turned on, and as is it turned up, the effective length of the amplifier(s) is tuned to maintain the cavity modes in a fixed position relative to the grating. The effective length of the amplifier(s) can be tuned using a conventional heater. The optical grating is preferably a fiber grating or a waveguide grating. These methods are most preferable for hybrid devices, such as a fiber grating semiconductor laser.

Figure 7:
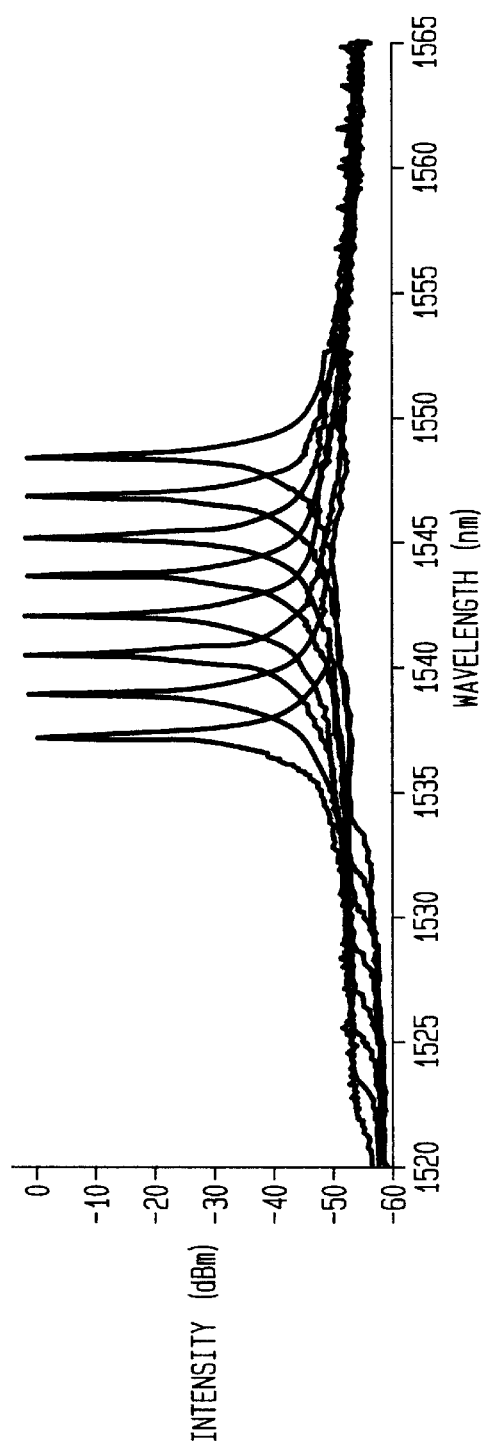
FIG. 7 is a graph of measured lasing spectra for the channels in an exemplary device in accordance with the present invention.

A device having eight channels according to the present invention was fully packaged and tested. The lasing spectra of all eight channels are shown in FIG. 7 with 75 mA being supplied to the shared amplifier and 75 mA being supplied to each array amplifier in turn. The temperature was 17° C. and the channels are shown from right to left. Fiber coupled powers greater than 1 mW per channel are obtained. All channels are single-longitudinal mode (linewidths 2 to 3 MHz) with a cavity side-mode suppression ratio of greater than 27 dB and router side-passband suppression of greater than 53 dB. Cavity mode spacing is 3.15 GHz and the linewidth enhancement parameter α=6.5. The peak-to-peak ripple in the spontaneous emission from the shared amplifier at 100 mA due to active-passive interface reflections is less than 0.5 dB. The measured 3 dB router passband widths are 25 to 27 GHz.

Figure 8:
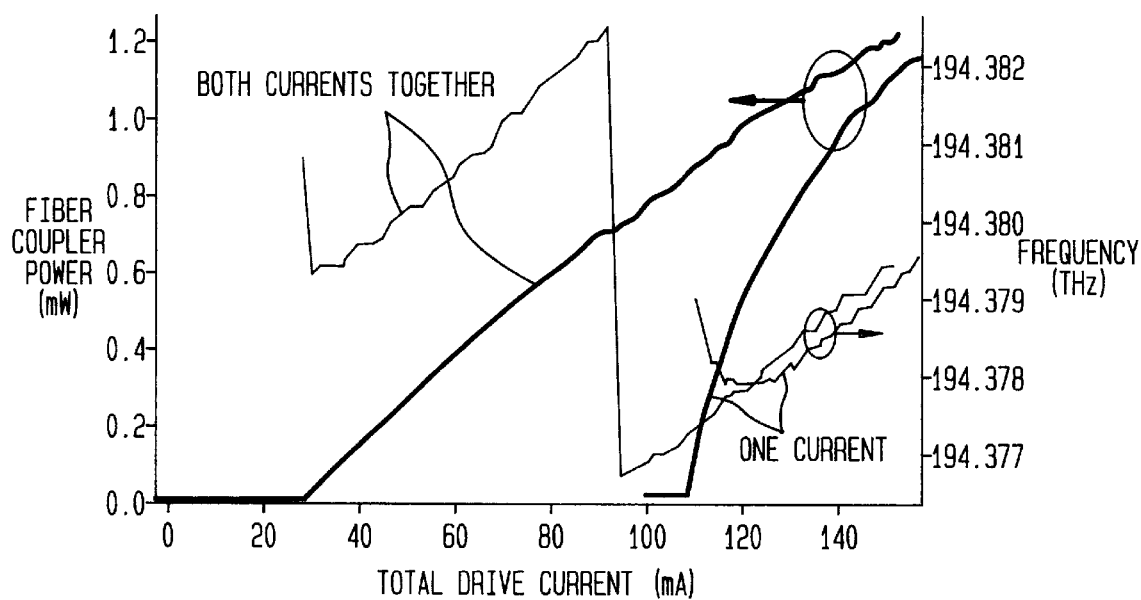
FIG. 8 is a graph of optical power and frequency vs. total drive current for one of the channels an exemplary device in accordance with the present invention.

FIG. 8 shows light-current and frequency-current curves for channel 5. FIG. 8 is a graph of optical power and frequency vs. total drive current for channel 5. The total threshold current is 30 mA at 18° C. The two left-most curves show the case when both amplifiers are driven together in a parallel connection, and the other two show when only the array amplifier current is changed while the shared amplifier current is held at 100 mA. The lasing frequency increases (i.e., cavity length decreases) with increasing current. From considering only carrier density changes, the cavity modes move in frequency Δf with change in current ΔI as $$\frac{\Delta f}{\Delta I} = \frac{\alpha \epsilon}{2\pi e w_a h_a v_g} \text{(cavity} FSR\text{)} \quad (10)$$

where ε=gain nonlinearity coefficient, e=charge of an electron, $w_a$=active layer width, $h_a$=active layer thickness, and $v_g$=group velocity. Parameters for this laser are α=6.5, ε=2×10$^{-23}$ m³, $w_a$=1.5 μm, $h_a$=0.04 μm, $v_g$=8.31×10⁷ m/s, and cavity FSR=3.15 GHz, resulting in Δf/ΔI=82 MHz/mA, which is close to the measured slope, 60 MHz/mA. From the left-most frequency curve of FIG. 8, once the lasing mode has shifted past a certain point under the router passband, which does not shift with current because it is in completely passive material, a mode-hop occurs. This is because the lasing mode leaves the region of single-mode stability.

Lasing is then reestablished two cavity modes away with strong hysteresis.

To further decrease the likelihood of mode hopping in the laser, a high current (approximately greater than 100 mA) is first applied to one amplifier (e.g., the shared amplifier) with 0 mA being supplied to the other (e.g., array amplifier). The carrier density will be high in the shared amplifier since there is no lasing. Current is then applied to the array amplifier, and as the lasing passes threshold, the carrier density in the shared amplifier will rapidly decrease. As the array current is increased further the total carrier density in the cavity will increase again. This causes a "u" shape in the frequency vs. current curve (second set of curves in FIG. 8). Because the lasing near threshold is near the peak of the filter, and the total frequency change to reach the operating condition is small when using this start-up procedure, the lasing mode can be reliably positioned in the center of the single-mode stability region at the operating condition. The device temperature can then be changed at will since the router and cavity temperature dependencies are identical.

Figure 9A:
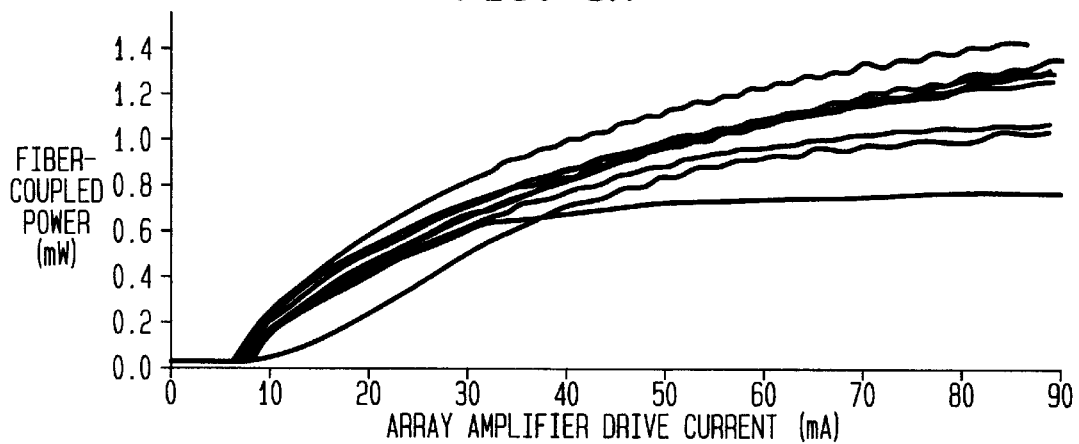
FIG. 9(a) is a graph of optical power vs. array amplifier drive current for an exemplary device in accordance with the present invention.
Figure 9B:
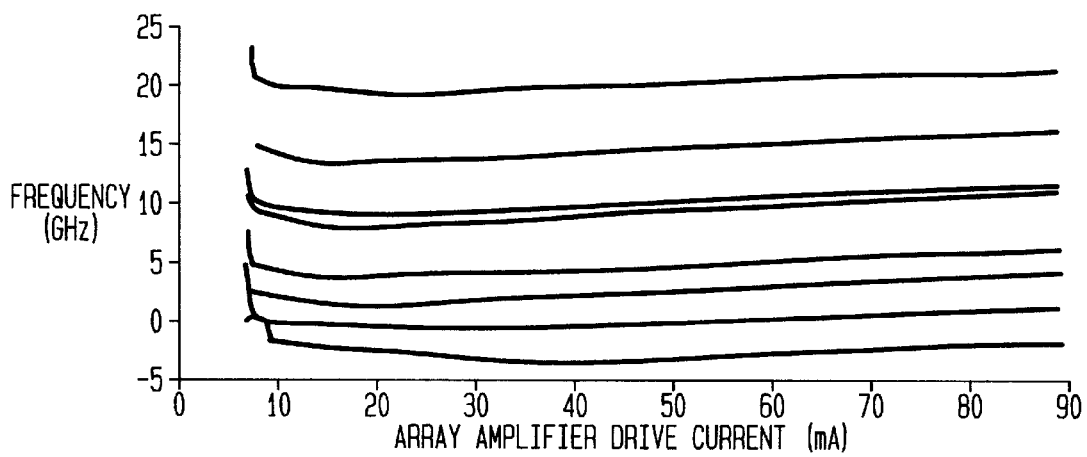
FIG. 9(b) is a graph of frequency vs. array amplifier drive current for an exemplary device in accordance with the present invention.

FIGS. 9(a) and 9(b) show the optical power vs. array amplifier drive current and frequency vs. array amplifier drive current plots, respectively, for all eight channels with the shared amplifier current set at 100 mA, demonstrating that no mode-hops occur for any of the channels when this turn-on procedure is used. The frequency plots are f−(200.0 GHz)(n−1)−$f_1$, and the channels are shown from bottom to top.

Figure 10A:
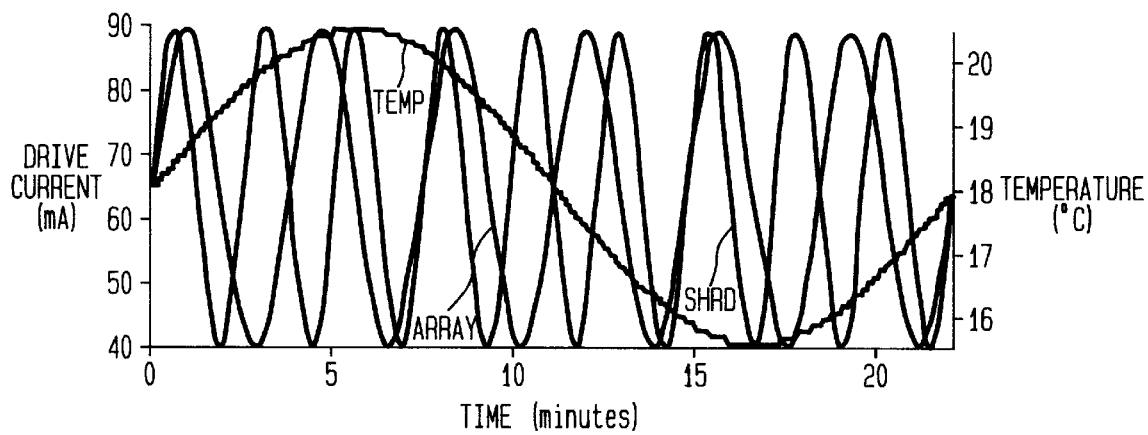
FIG. 10(a) is a graph of device temperature, array amplifier current, and shared amplifier current vs. time in a single-mode stability test for an exemplary device in accordance with the present invention.

A stringent, fully computerized test of the single-mode stability was performed. To turn on a channel, 100 mA was applied to the shared amplifier, then 65 mA was applied to the appropriate array amplifier, and then the shared amplifier current was reduced to 65 mA. Then the device temperature was oscillated from 15.5° to 20.5° C., and both currents were oscillated ±25 mA for a total current change of 100 mA, as shown in FIG. 10(a). FIG. 10(a) is a graph of device temperature, array amplifier current, and shared amplifier current vs. time in a single-mode stability test for an exemplary device in accordance with the present invention.

Figure 10B:
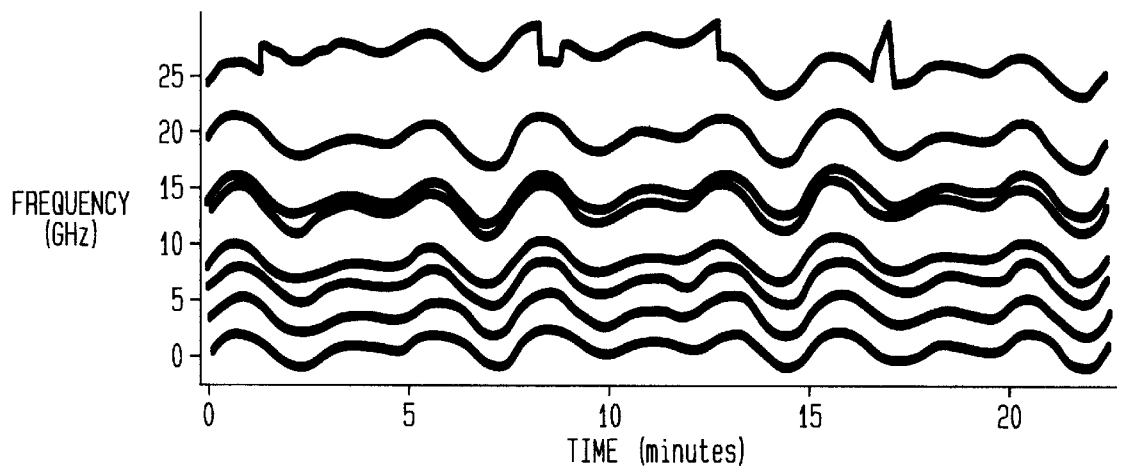
FIG. 10(b) is a graph of resulting frequency vs. time for each channel in a single-mode stability test for an exemplary device in accordance with the present invention.

FIG. 10(b) is a graph of resulting frequency vs. time for each channel, with the channels going from bottom to top. FIG. 10(b) shows f+(14.17 GHz/°C.)T−(200.0 GHz)(n−1)−$f_1$ for each channel, where f is the measured lasing frequency, T is the device temperature, n is the channel number and $f_1$ is the lasing frequency of channel 1. There are no mode hops despite large swings in the lasing frequency, except for channel 8 which is likely due to cavity imperfections. FIG. 10(b) also shows that the channel spacing is approximately 203 GHz, with a standard deviation of approximately the cavity mode spacing (approximately 3 GHz).

Figure 11:
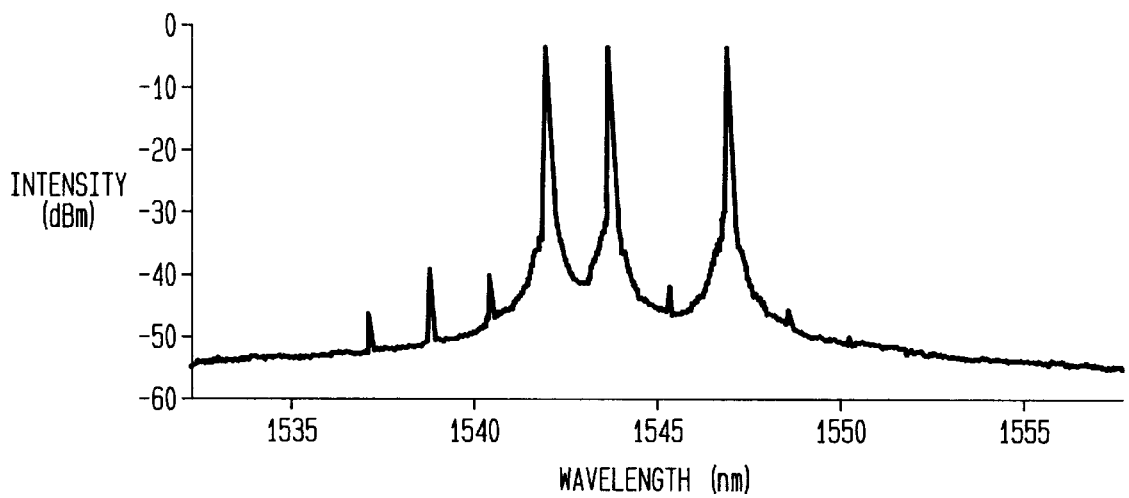
FIG. 11 is a graph of a spectrum when several channels of an exemplary device in accordance with the present invention are simultaneously lasing.

Gain nonlinearities not only provide single-mode stability, but also generate mixing products in the shared amplifier when more than one channel is operated simultaneously, as shown in FIG. 11. FIG. 11 is a graph of a spectrum when channels 2, 4 and 5 of the exemplary device are simultaneously lasing at a temperature of 18° C. The small spikes are wave-mixing products. When the mixing products overlap with another lasing channel, the channel powers spontaneously fluctuate. Thus, multichannel simultaneous operation is limited to channel combinations where wave mixing products do not overlap with the channels, as in FIG. 11. If simultaneous operation of all channels were desired, the shared amplifier can be eliminated.

In summary, a waveguide grating wavelength selectable laser having greater than 1 mW fiber-coupled power and strong inherent wavelength and single-mode stability is provided.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A single-mode stabilized laser, comprising:
   a laser cavity defined by two reflective elements in an actively doped semiconductor wafer, the cavity having a round trip time $\tau_r$ and a linewidth enhancement parameter $\alpha$; and
   a frequency routing device formed in the laser cavity comprising a plurality of controllable frequency selective pathways optically connecting the reflective elements such that selective gating of one or more of the frequency selective pathways causes selected one or more lasing frequencies to be supported in the laser cavity separated by a frequency spacing $\Delta F_C$, $\Delta F_C = 1/\tau_r$, said frequency routing device comprising:
      an optical grating comprising a plurality of unequal length waveguides to form a plurality of paths including a longest path and a shortest path, said optical grating having (1) a plurality of arms including a longest arm and a shortest arm, each arm having a respective path length, (2) a time delay $\tau_f$ between the longest path and the shortest path, and (3) a grating bandwidth $\Delta F_F$, $\Delta F_F = 1/\tau_f$, at least one of (1) $\alpha$ and (2) $\tau_r$ and $\tau_f$ having sufficient value to stabilize the laser in single-mode operation.

2. The laser of claim 1, wherein the ratio $(\Delta F_C)^3/\Delta F_F$ is substantially maximized to stabilize the laser in single-mode operation.

3. The laser of claim 1, wherein $1/\tau_f=32$ GHz and $1/\tau_r=3.5$ GHz.

4. The laser of claim 1, wherein $\alpha$ has a value in the range between 1 and 5.

5. The laser of claim 1, wherein the path length difference between the longest arm and the shortest arm is approximately equal to one-sixth the length of said laser cavity if said optical grating had only one arm.

6. The laser of claim 1, wherein said frequency routing device further comprises:
   at least one input waveguide;
   a first free space region connected to said at least one input waveguide;
   a plurality of output waveguides connected to said first free space region and connected to said optical grating;
   a plurality of input waveguides connected to said optical grating;
   a second free space region connected to said plurality of input waveguides connected to said optical grating; and
   a plurality of output waveguides connected to said second free space region.

7. The laser of claim 6, further comprising a plurality of optical amplifiers in the frequency selective pathways.

8. The laser of claim 7, further comprising a control circuit for selectively activating said optical amplifiers to define a predetermined frequency selective pathway in said laser cavity and to create lasing action in the predetermined frequency selective pathway.

9. The laser of claim 7, wherein the path lengths in said optical grating have a nonlinear distribution.

10. The laser of claim 9, wherein the nonlinear distribution is a parabolic distribution.

11. The laser of claim 9, wherein said plurality of input waveguides connected to said second free space region have a nonlinear angular position distribution.

12. The laser of claim 11, wherein the nonlinear angular position distribution is a parabolic distribution.

13. The laser of claim 9, wherein each of said plurality of output waveguides connected to said second free space region have a respective entrance at a radial location, each of said radial locations being nonconstant.

14. A method of turning on a laser to a stable operating condition, the laser having a first amplifier connected to a first side of a waveguide grating and a second amplifier connected to a second side of the waveguide grating, the first amplifier operable at a first operating current and the second amplifier operable at a second operating current, comprising the steps of:
   applying an initial current to the first amplifier and maintaining the second amplifier off, the initial current having a value not less than the first operating current;
   applying the second operating current to the second amplifier; and
   applying the first operating current to the first amplifier to stably operate the laser.

15. The method of claim 14, further comprising the step of allowing the laser to reach thermal equilibrium prior to the step of applying the second operating current to the second amplifier.

16. The method of claim 14, wherein the initial current has a value greater than 100 mA.

17. A method of turning on a laser to a stable operating condition, the laser having a plurality of cavity modes and at least one amplifier connected to an optical grating, comprising the steps of:
   applying an operating current to the amplifier by ramping an applied current from zero to the operating current; and
   tuning the optical grating while the applied current is being ramped to maintain the cavity modes in a fixed position relative to the optical grating.

18. The method of claim 17, wherein the step of tuning is performed using a heater.

19. The method of claim 17, wherein the optical grating is one of a fiber grating and a waveguide grating.

20. A method of turning on a laser to a stable operating condition, the laser having a plurality of cavity modes and at least one amplifier having an effective length connected to an optical grating, comprising the steps of:
   applying an operating current to the amplifier by ramping an applied current from zero to the operating current; and
   tuning the effective length of the at least one amplifier to maintain the cavity modes in a fixed position relative to the optical grating.

21. The method of claim 20, wherein the step of tuning is performed using a heater.

22. The method of claim 20, wherein the optical grating is one of a fiber grating and a waveguide grating.

23. A system for lasing light comprising:
   a laser cavity defined by two reflective elements in an actively doped semiconductor wafer, said laser cavity having a round trip time $\tau_r$ and a linewidth enhancement parameter $\alpha$;
   a frequency routing device formed in said laser cavity comprising a plurality of controllable frequency selective pathways optically connecting the reflective elements such that selective gating of one or more of the frequency selective pathways causes selected one or more lasing frequencies to be supported in said laser cavity separated by a frequency spacing $\Delta F_C$, $\Delta F_C = 1/\tau_r$, said frequency routing device comprising:

an optical grating comprising a plurality of unequal length waveguides to form a plurality of paths including a longest path and a shortest path, said optical grating having (1) a plurality of arms including a longest arm and a shortest arm, each arm having a respective path length, (2) a time delay $\tau_f$ between the longest path and the shortest path, and (3) a grating bandwidth $\Delta F_F$, $\Delta F_F = 1/\tau_f$, at least one of (1) $\alpha$ and (2) $\tau_r$ and $\tau_f$ having sufficient value to stabilize the system in single-mode operation;

a plurality of optical amplifiers in the frequency selective pathways; and a control circuit for selectively activating said optical amplifiers to define a predetermined frequency selective pathway in said laser cavity and to create lasing action in the predetermined frequency selective pathway.

\* \* \* \* \*